(12) United States Patent
Kachi et al.

(10) Patent No.: US 6,774,536 B2
(45) Date of Patent: Aug. 10, 2004

(54) SURFACE ACOUSTIC WAVE DEVICE

(75) Inventors: Tsuyoshi Kachi, Kokubunji (JP); Atsushi Isobe, Kodaira (JP); Atsushi Sumioka, Kokubunji (JP)

(73) Assignees: Hitachi, Ltd., Tokyo (JP); Hitachi Kokusai Electric Inc., Tokyo (JP)

( * ) Notice: Subject to any disclaimer, the term of this patent is extended or adjusted under 35 U.S.C. 154(b) by 139 days.

(21) Appl. No.: 09/907,614

(22) Filed: Jul. 19, 2001

(65) Prior Publication Data

US 2002/0044497 A1 Apr. 18, 2002

(30) Foreign Application Priority Data

Sep. 6, 2000 (JP) ........................................ 2000-275009

(51) Int. Cl.[7] .............................. H01L 41/08; H03H 9/25
(52) U.S. Cl. ............................. 310/313 B; 310/313 C; 333/195
(58) Field of Search ......................... 310/313 B, 313 C; 333/195

(56) References Cited

U.S. PATENT DOCUMENTS

| | | | | |
|---|---|---|---|---|
| 3,931,597 A | * | 1/1976 | Cho et al. ............... | 310/313 C |
| 4,028,649 A | * | 6/1977 | Komatsu et al. ......... | 310/313 B |
| 4,081,769 A | * | 3/1978 | Shreve .................... | 310/313 B |
| 4,912,356 A | * | 3/1990 | Mariani et al. .......... | 310/313 B |
| 5,087,901 A | * | 2/1992 | Kurosawa et al. ....... | 310/313 B |
| 5,136,266 A | * | 8/1992 | Niitsuma ................. | 310/313 B |
| 5,142,185 A | * | 8/1992 | Noel et al. .............. | 310/313 B |
| 5,471,179 A | * | 11/1995 | Koshkin et al. ......... | 310/313 C |
| 5,477,098 A | * | 12/1995 | Eguchi et al. ........... | 310/313 B |
| 5,717,274 A | * | 2/1998 | Eguchi et al. ........... | 310/313 B |
| 5,818,310 A | * | 10/1998 | Solie ....................... | 310/313 B |
| 6,025,763 A | * | 2/2000 | Morimoto ............... | 310/313 C |
| 6,344,705 B1 | * | 2/2002 | Solal et al. ............. | 310/313 B |
| 6,346,761 B1 | * | 2/2002 | Isobe et al. ............. | 310/313 B |
| 2001/0040489 A1 | * | 11/2001 | Matsuda et al. ............ | 333/193 |
| 2002/0057035 A1 | * | 5/2002 | Nakamura et al. ...... | 310/313 B |

FOREIGN PATENT DOCUMENTS

JP            6-85602            3/1994

OTHER PUBLICATIONS

Transactions of the Institute of Electronics, Information and Communication Engineers, vol. J. 75–A, No. 3, Mar. 1992, H. Shimizu et al, "Small–Size Love–Type SAW Resonators with Very Low Capacitance Ratio", pp. 458–466.
Proceedings of the 20th Symposium on Ultrasonic Electronics, Nov. 1999, A. Isobe et al, "High–Q Wide–Band SAW Resonators for VCO", pp. 63–64.

* cited by examiner

Primary Examiner—Burton S. Mullins
Assistant Examiner—J. Aguirrechea
(74) Attorney, Agent, or Firm—Mattingly, Stanger & Malur, P.C.

(57) ABSTRACT

In a surface acoustic wave resonator in which an interdigital transducer is formed on a piezoelectric substrate with apodization based on cross lengths of electrode fingers and the inside face of each bus bar is not parallel to a group velocity direction of a surface acoustic wave excited on the interdigital transducer, reflector electrode fingers and excitation-area electrode fingers are disposed to provide relatively shifted positioning therebetween in the group velocity direction of the surface acoustic wave or a distance between the periphery of an excitation area and the inside face of each bus bar is limited within a predetermined range.

12 Claims, 16 Drawing Sheets

SURFACE ACOUSTIC WAVE DEVICE

BACKGROUND OF THE INVENTION

1. Field of the Invention

The present invention relates to a surface acoustic wave device used for telecommunication equipment.

2. Description of the Related Art

A surface acoustic wave device, used for conversion between an electric signal and a surface acoustic wave (SAW), comprises interdigital transducers (IDTs) formed of electrode fingers interdigitated on a piezoelectric substrate. Among various kinds of surface acoustic wave devices, a surface acoustic wave resonator (SAW resonator), in particular, has advantages such as compactness, light weight and no-adjustment requirement, and is in widespread use as a device for telecommunication equipment.

Referring to FIG. 1, there is shown a plan view of a basic structure of a conventional SAW resonator. On a piezoelectric substrate 101, an IDT is formed of a plurality of electrode fingers 102 arranged in an interdigital configuration, a pair of bus bars 104 which are opposed to each other and connected with the electrode fingers 102 in an alternate fashion, input/output ports 105 and 106, and a plurality of fingers 107 which are opposed to the electrode fingers 102 on the open node side thereof and connected with each of the opposing bus bars 104 to provide a reflector function. When a high-frequency electric signal is applied across the input/output ports 105 and 106, an electric field is produced between the electrode fingers 102 arranged in the interdigital configuration to excite surface acoustic waves on the surface of the piezoelectric substrate 101. In surface acoustic wave excitation, an excited surface acoustic wave having a wavelength identical to an interdigital pattern period P of the electrode fingers 102 and a surface acoustic wave having a wave number vector parallel to the direction of arrow 103 are excited most intensely since they are in phase on an electrode finger crossover area. In the SAW resonator shown in FIG. 1, a surface acoustic wave leaks out of the IDT through both sides thereof to cause a large energy loss, resulting in a low Q value in resonance.

Referring to FIG. 2, there is shown an exemplary electrode configuration of a conventional SAW resonator designed for Q-factor improvement over the conventional SAW resonator in FIG. 1 (proposed in Japanese Unexamined Patent Publication No. H6 (1994)-85602 and "Small-Size Love-Type SAW Resonators with Very Low Capacitance Ratio" by Hiroshi Shimizu and Yuji Suzuki —The Transactions of the Institute of Electronics, Information and Communication Engineers, A Vol. J. 75-A NO. 3 pp. 458–466, March 1992). In this exemplary configuration in which a surface acoustic wave crossing over the electrode fingers 102 is excited on a rhombic area 108 (excitation area) enclosed by the broken line, apodization is made in a fashion that the cross lengths W of the electrode fingers 102 are maximum at the center of the IDT and zero at both ends thereof, thereby reducing a degree of spurious response. Further, leakage of a surface acoustic wave out of the IDT through both sides thereof is reduced since the excitation area 108 is narrowed on both sides of the IDT and surface acoustic wave reflection is made by a reflector 109 comprising the electrode fingers 107 which are so arranged on the periphery of the excitation area 108 as to oppose the electrode fingers 102 in a grating form. Thus, an energy loss can be decreased to improve the Q factor. Note that in addition to the electrode fingers 107 functioning as elements of the reflector 109, parts of the electrode fingers 102 disposed on the periphery of the excitation area 108 also serve as reflector elements. That is to say, some parts of the electrode fingers 102 are used for excitation and the other parts of the electrode fingers 102 are used for reflection, depending on the locations thereof.

In the SAW resonator having the electrode configuration shown in FIG. 2, the electrode fingers on both sides of the IDT are opposed mutually in parallel. Therefore, the electrode fingers on both sides of the IDT reflect a surface acoustic wave component having a wave number vector parallel to the direction of the arrow 103 (inharmonic higher-order longitudinal mode component), causing a standing wave having a waveform such as 201. Furthermore, in the SAW resonator having the electrode configuration shown in FIG. 2, the boundaries between a region of the reflector 109 and the bus bars 104 are opposed mutually in parallel. Therefore, a surface acoustic wave component having a wave number vector perpendicular to the direction of the arrow 103 (inharmonic higher-order transverse mode component) is reflected on the boundaries between the reflector 109 and the bus bars 104, causing a standing wave having a waveform such as 202. These standing waves produces spurious response in an impedance characteristic of the SAW resonator.

FIG. 3 shows an example of an impedance characteristic of the conventional SAW resonator shown in FIG. 2. The conventional SAW resonator in FIG. 2 is fabricated in the following manner: On a piezoelectric substrate made of 15°-rotated Y-cut X-propagation lithium niobate (hereinafter referred to simply as 15° YX-LN), aluminum is deposited by evaporation method, and an IDT electrode pattern is formed by photolithography and dry etching method. In FIG. 3, reference numeral 112 indicates a peak corresponding to a series resonance frequency of the SAW resonator. As shown in this figure, a multiplicity of spurious response peaks occur in a lower-frequency region 113 with respect to the series response frequency. These multiple spurious response peaks give rise to considerable problems, particularly in a case where the SAW resonator is employed as an oscillation element in a voltage controlled oscillator (VCO). Where the SAW resonator is employed as a VCO oscillation element, an expansion coil is connected to the SAW resonator and the lower-frequency region 113 with respect to the series resonance frequency thereof is used for resonant oscillation. Since spurious response in a VOC oscillation frequency region incurs a frequency discontinuity state, the spurious response peaks in the lower-frequency region 113 are critically problematic in operation.

Referring to FIG. 4, there is shown an exemplary electrode configuration of a conventional SAW resonator designed for improvement over the conventional SAW resonator in FIG. 2 (proposed in "High-Q Wide-band SAW Resonators for VCO" by Atsushi Isobe et al.—Proceedings of the 20th Symposium on Ultrasonic Electronics, pp. 63, November 1999). In this example, the inside face of each of the bus bars 104 is formed in parallel with the periphery of the excitation area 108 so that a phase of a standing wave and a frequency incurring a standing wave are unrelated to the propagation direction of a surface acoustic wave for suppression of spurious response.

SUMMARY OF THE INVENTION

Although the conventional SAW resonator shown in FIG. 4 is successful as far as the suppression of spurious response is concerned, it is unsatisfactory for use as a VCO oscillation element. FIG. 5 is a graph indicating an exemplary impedance characteristic of the conventional SAW resonator shown in FIG. 4. In fabrication of the conventional SAW resonator in FIG. 4, aluminum is deposited on a piezoelectric substrate made of 15° YX-LN by evaporation method, and an IDT electrode pattern is formed by photolithography and dry etching method.

In the conventional SAW resonator in FIG. 4, although a flat impedance characteristic having virtually no spurious response is attained in a lower-frequency region with respect to a peak 112 corresponding to a series resonance frequency thereof, a ripple 111 exists around a frequency of 207 MHz. Where the conventional SAW resonator in FIG. 4 is used as a VCO oscillation element, an oscillation frequency discontinuity occurs in the vicinity of the frequency corresponding to the ripple 111. For this reason, the conventional SAW resonator in FIG. 4 is not applicable as a VCO oscillation element in a frequency band including the frequency corresponding to the ripple 111.

It is therefore an object of the present invention to provide an SAW resonator which is capable of suppressing occurrence of a ripple in an impedance characteristic thereof for application to wideband VCO operation.

Recognizing that the ripple 111 in the impedance characteristic shown in FIG. 5 is caused by the scattering of a surface acoustic wave on the reflector 109 of the SAW resonator in FIG. 4, the inventors herein propose a technique for suppressing occurrence of the ripple by disposing the electrode fingers 107 constituting the reflector 109 in an arrangement relatively shifted with respect to the electrode fingers 102 on the excitation area 108 or by optimizing the lengths of the electrode fingers 107 constituting the reflector 109.

The above and other objects, features and advantages of the present invention will become more apparent from the following detailed description with reference to the accompanying drawings.

DESCRIPTION OF THE PREFERRED EMBODIMENTS

The present invention will now be described in detail by way of example with reference to the accompanying drawings.

Figure 6:
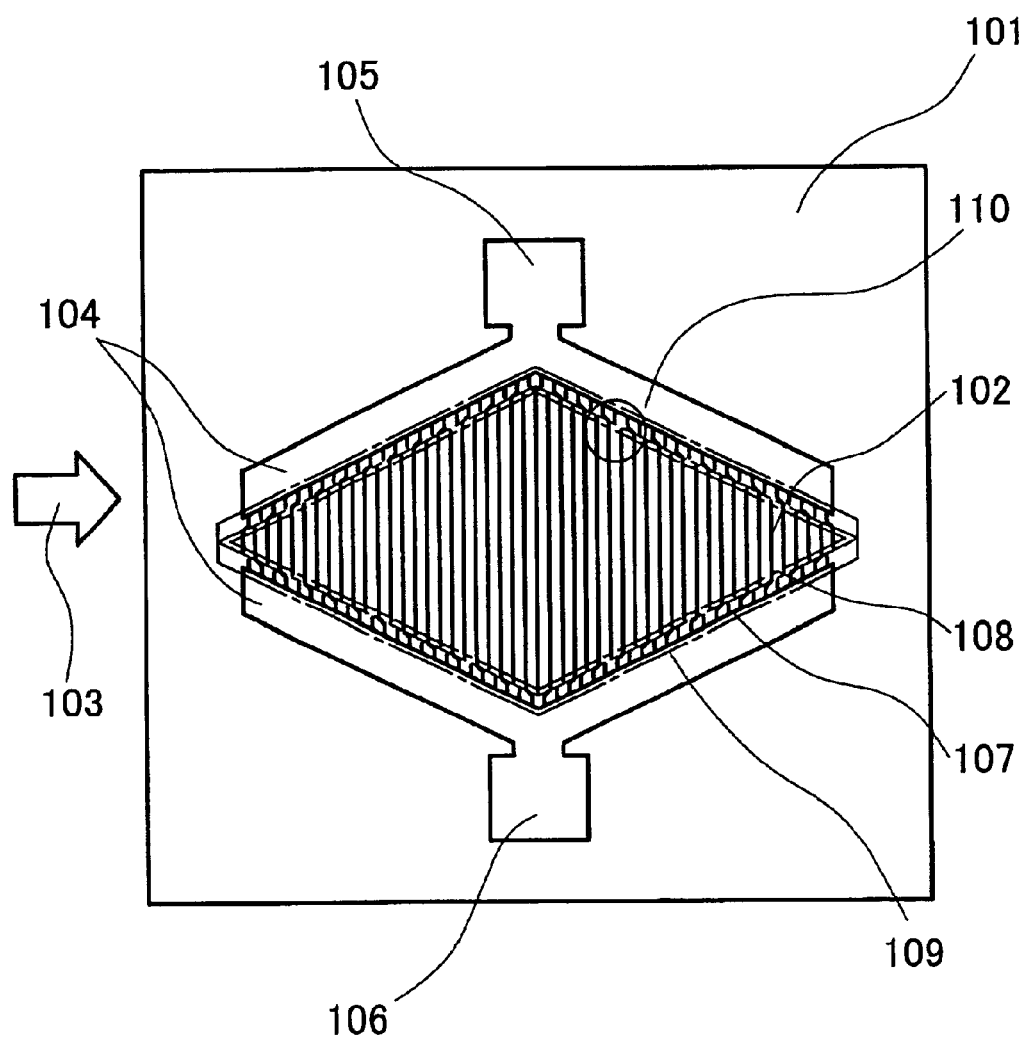
FIG. 6 is a plan view showing a first preferred embodiment of the present invention.
Figure 7:
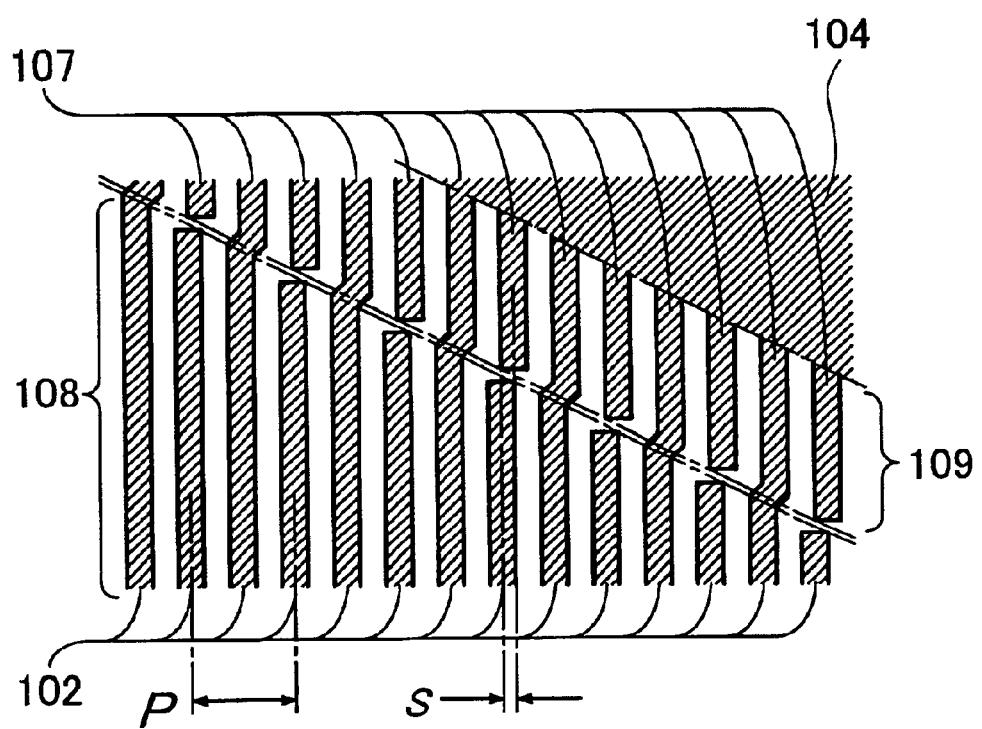
FIG. 7 is an explanatory diagram showing an enlarged view of a part 110 indicated in FIG. 6.

Referring to FIG. 6, there is shown a plan view of an SAW resonator in a first preferred embodiment of the present invention. A distinctive feature of the first preferred embodiment is that electrode fingers 102 on an excitation area 108 and electrode fingers 107 of a reflector 109 are disposed to provide relatively shifted positioning therebetween in a group velocity direction 103 of a surface acoustic wave. FIG. 7 shows an enlarged view of a part 110 indicated in FIG. 6. In the first preferred embodiment, the amount of relative shift "s" between each of the electrode fingers 102 on the excitation area and each of the electrode fingers 107 of the reflector 109 is ⅛ of an interdigital pattern period P of the electrode fingers 102. Further, rhombic apodization is made on the electrode fingers 102 so that the cross lengths of the electrode fingers 102 are maximized at the center of the excitation area 108 and minimized at both ends thereof. The inside face of each of bus bars 104 is disposed in parallel with the periphery of the excitation area.

Figure 1:
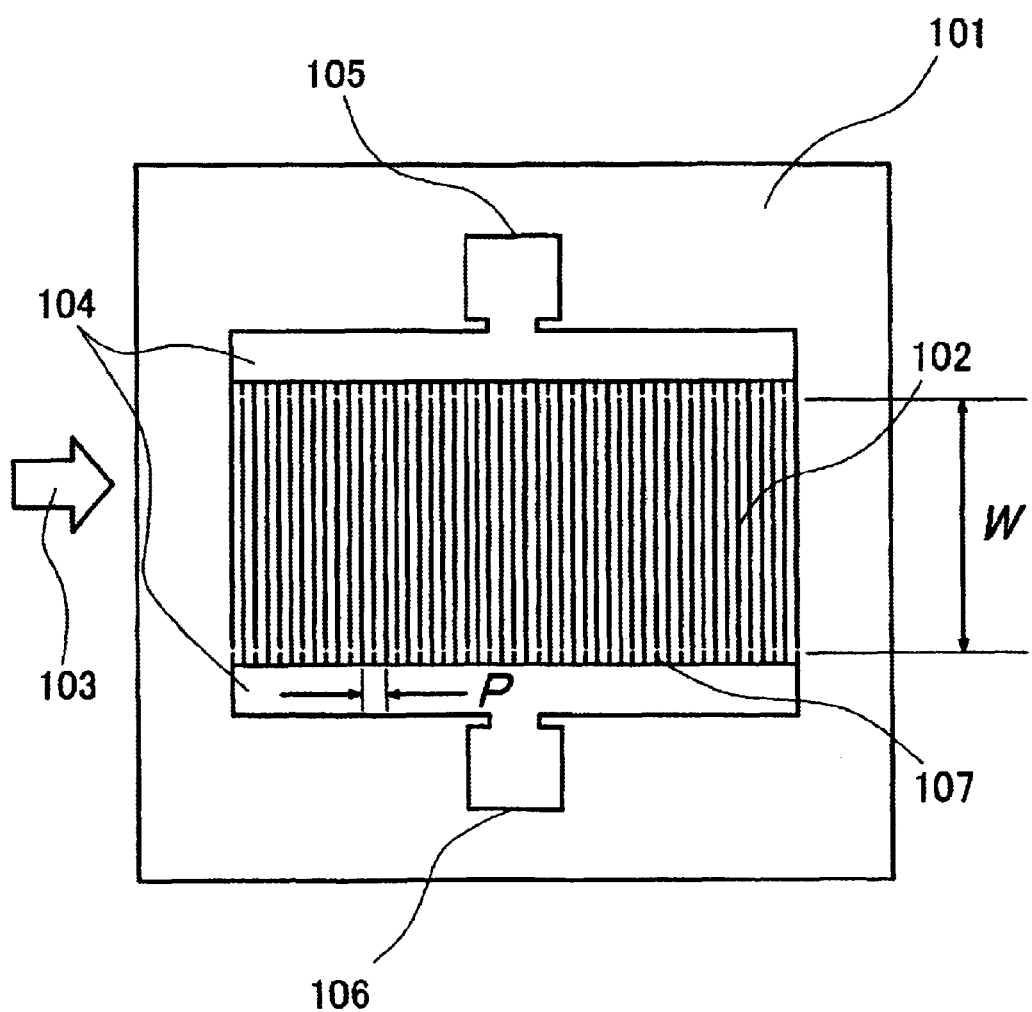
FIG. 1 is a plan view showing an electrode configuration of a conventional SAW resonator.
Figure 2:
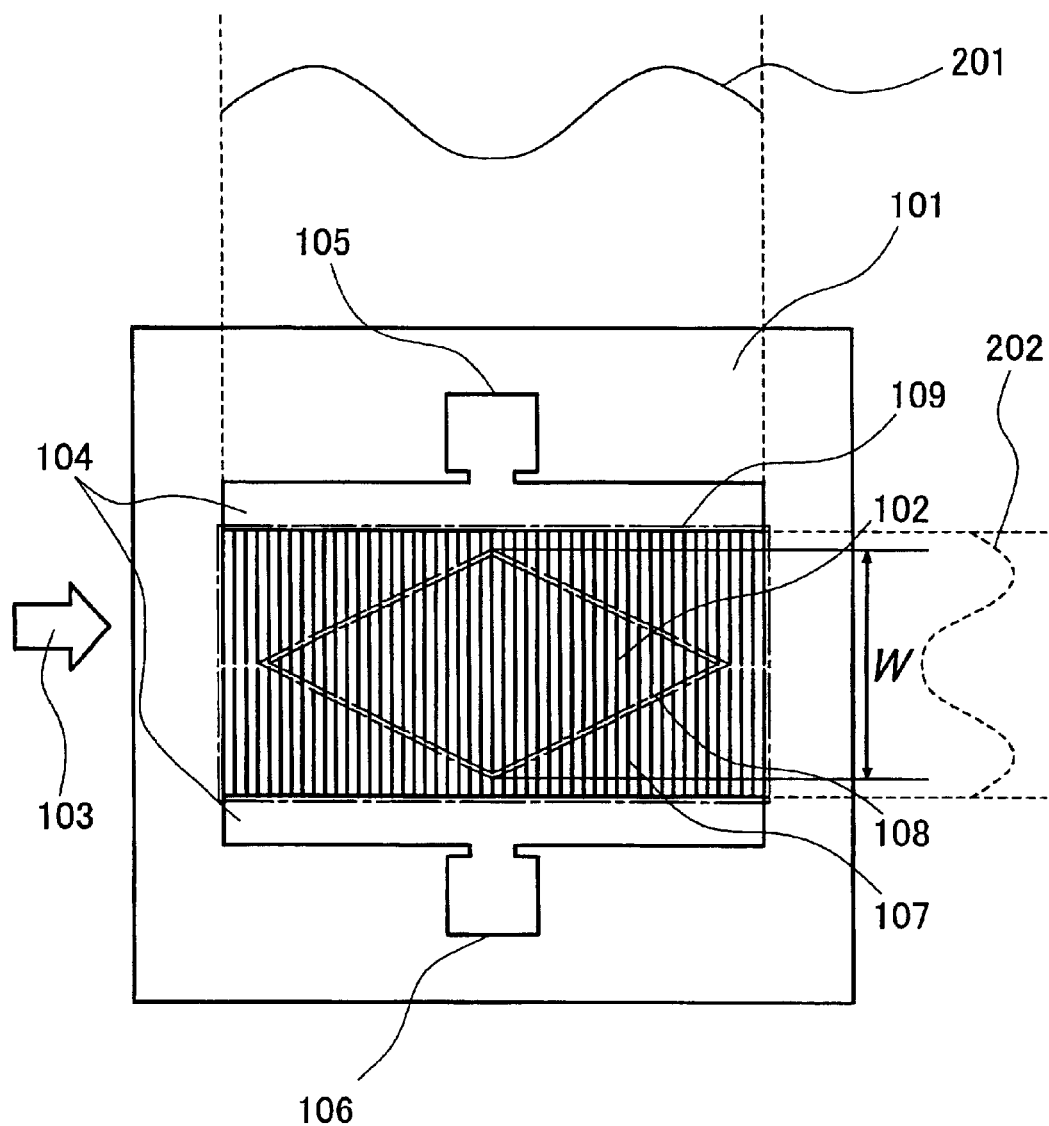
FIG. 2 is a plan view showing an electrode configuration of another conventional SAW resonator.
Figure 3:
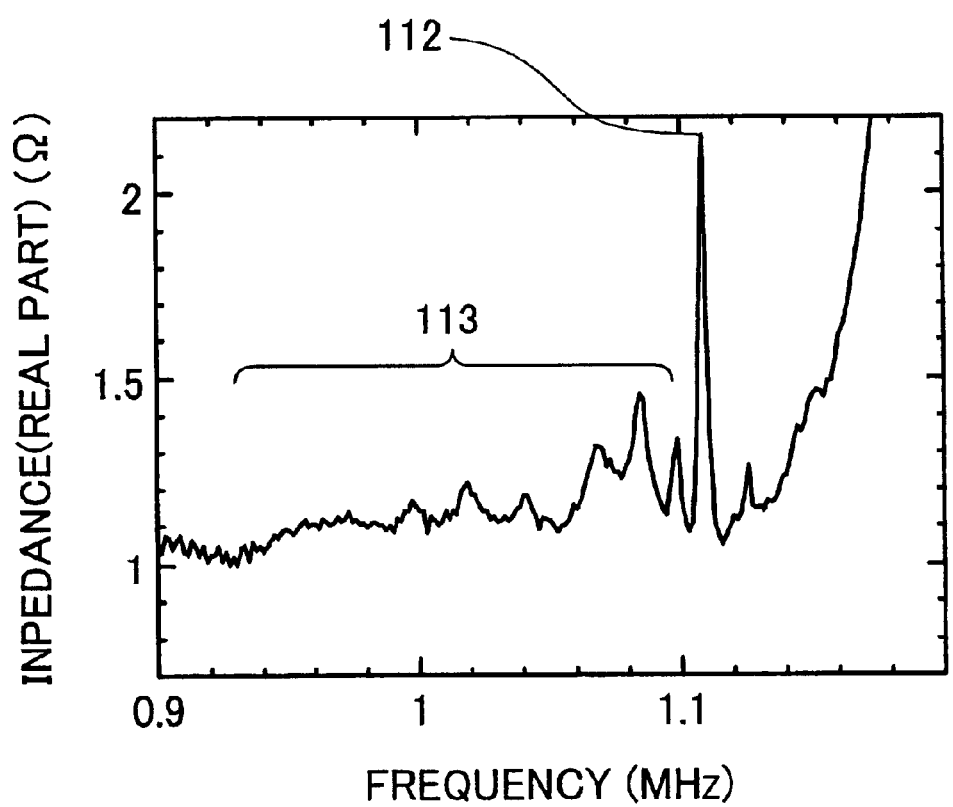
FIG. 3 is a graph showing an impedance characteristic of the SAW resonator in FIG. 2.
Figure 4:
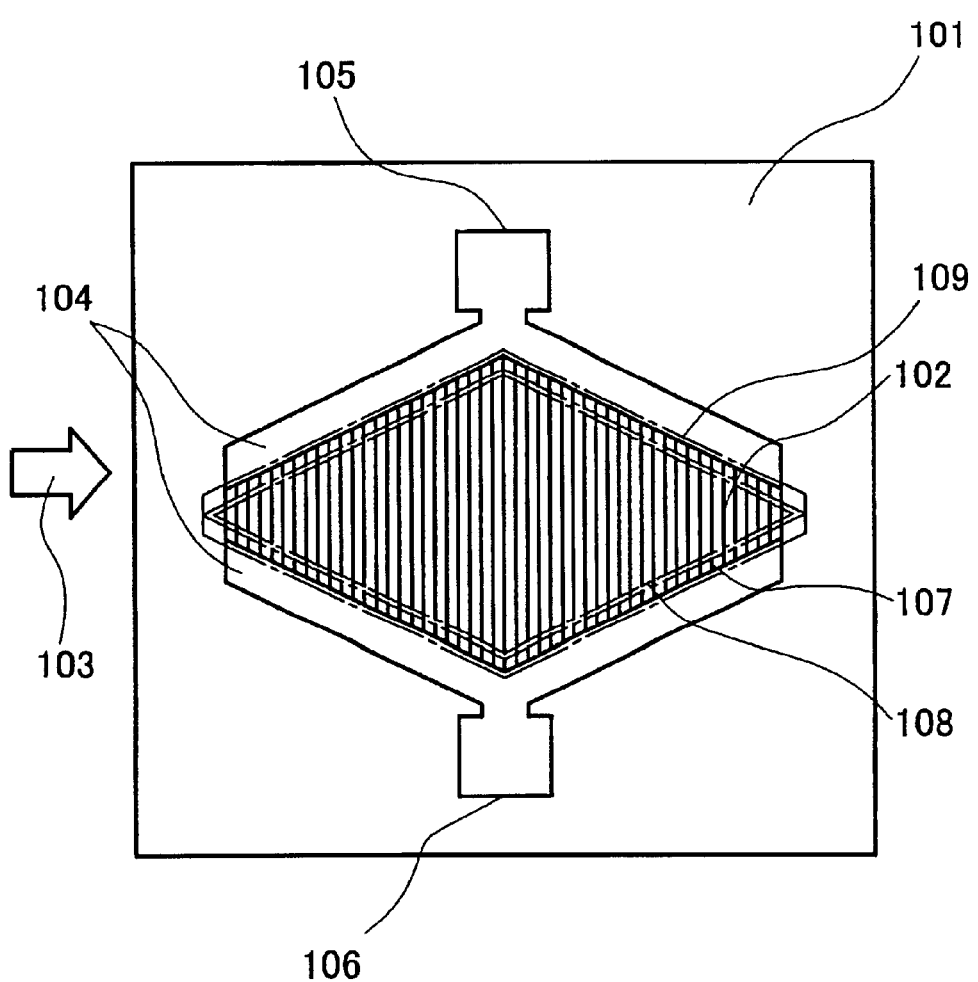
FIG. 4 is a plan view showing an electrode configuration of another conventional SAW resonator.
Figure 5:
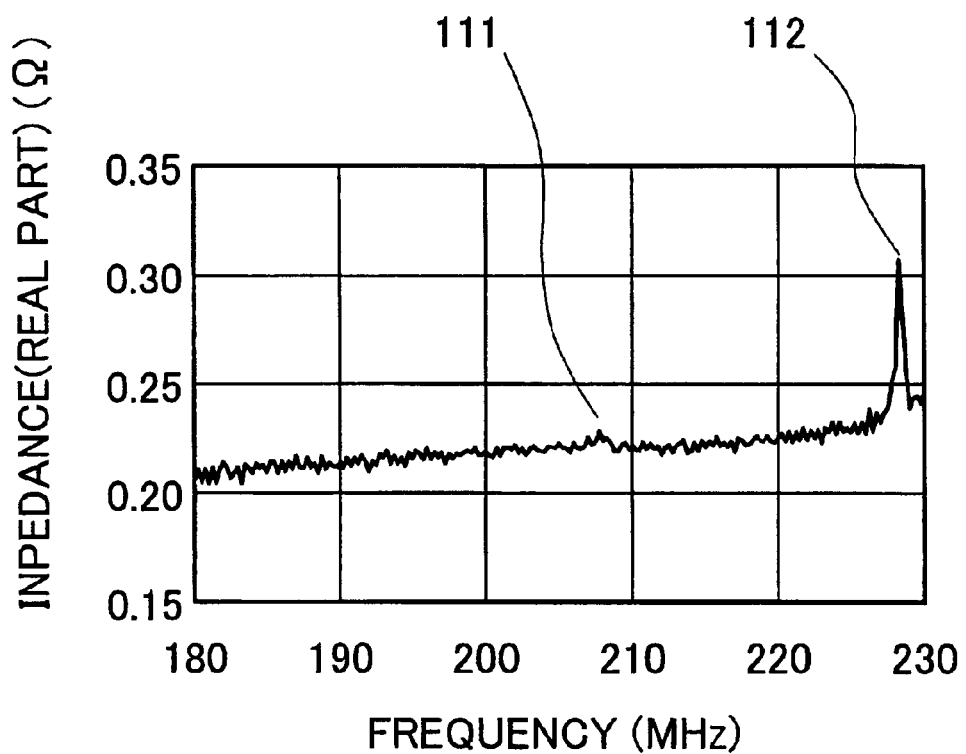
FIG. 5 is a graph showing an impedance characteristic of the SAW resonator in FIG. 4.
Figure 8:
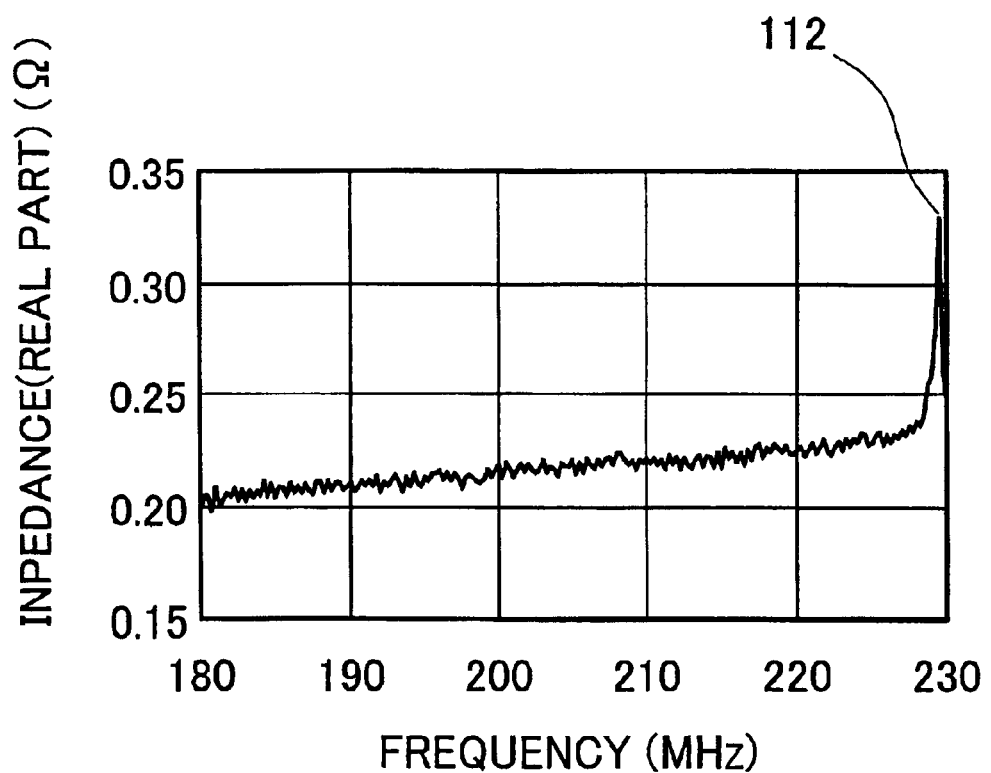
FIG. 8 is a graph showing an impedance characteristic of the first preferred embodiment of the present invention.

FIG. 8 shows an example of an impedance characteristic of the SAW resonator in FIG. 6. The SAW resonator in the first preferred embodiment is fabricated through a process similar to that for the conventional SAW resonator having the impedance characteristic shown in FIG. 5. As in fabrication of the conventional SAW resonator, a piezoelectric substrate made of 15° YX-LN is used. A film thickness of aluminum electrodes and an interdigital pattern pitch of electrode fingers in the first preferred embodiment are the same as those in the conventional SAW resonator. In the first preferred embodiment, the ripple 111 in the impedance characteristic indicated in FIG. 5 is removed satisfactorily, which signifies that the SAW resonator in the first preferred embodiment is applicable to a wide frequency band.

While the amount of relative shift "s" between each of the electrode fingers 102 and each of the electrode fingers 107 is P/8 in the first preferred embodiment, it is not necessarily required that the amount of relative shift "s" should be P/8. The inventors have fabricated experimental SAW resonators having "s" values of P/16, P/8, 3P/16, P/4 and 7P/16 for impedance characteristic evaluation. In the results of the evaluation, it has been confirmed that occurrence of the ripple 111 around 207 MHz can be suppressed in these experimental SAW resonators.

Figure 9:
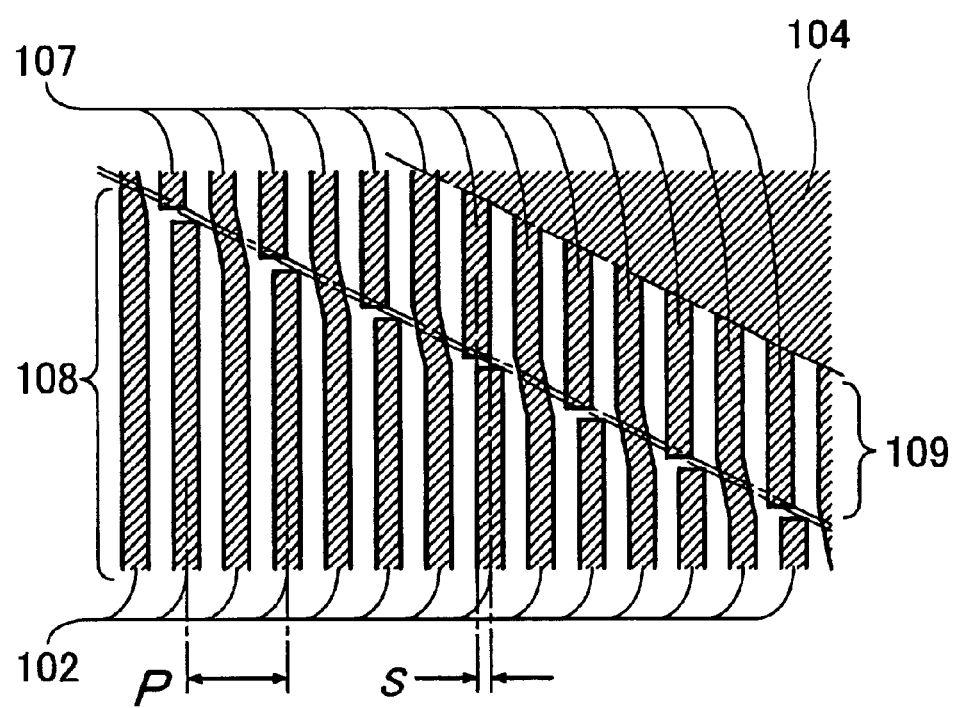
FIG. 9 is a plan view showing a second preferred embodiment of the present invention.

Referring to FIG. 9, there is shown a plan view of an SAW resonator in a second preferred embodiment of the present invention. In the second preferred embodiment, although the amount of relative shift "s" between each of the electrode filters 102 and each of the electrode fingers 107 is P/8 as in the first preferred embodiment, the direction of relative shift is opposite to that in the first preferred embodiment. The second preferred embodiment also provides an advantageous effect equivalent to that of the first preferred embodiment.

Note that parts of the electrode fingers 102 as well as the electrode fingers 107 serve as reflector elements as mentioned in the foregoing. This signifies that electrode fingers serving as reflector elements are disposed at an interdigital pattern pitch of P/2. Therefore, in an instance where the amount of relative shift "s" is set to meet the following expression (2), an equivalent advantageous effect can be attained.

$$s + \frac{P}{2}N \qquad (2)$$

For example, in cases of P/8 and 5P/8, an equivalent advantageous effect is attainable. Likewise, it is possible to attain an equivalent advantageous effect in cases of P/16 and 9P/16, in cases of 3P/16 and 11P/16, and in cases of P/4 and 3P/4. In practical applications, however, since a positional shift beyond each adjacent electrode finger would just result in structural complication, it is preferable to determine an optimum value within a range up to approximately 7P/16 as described with reference to FIG. 6.

Figure 10:
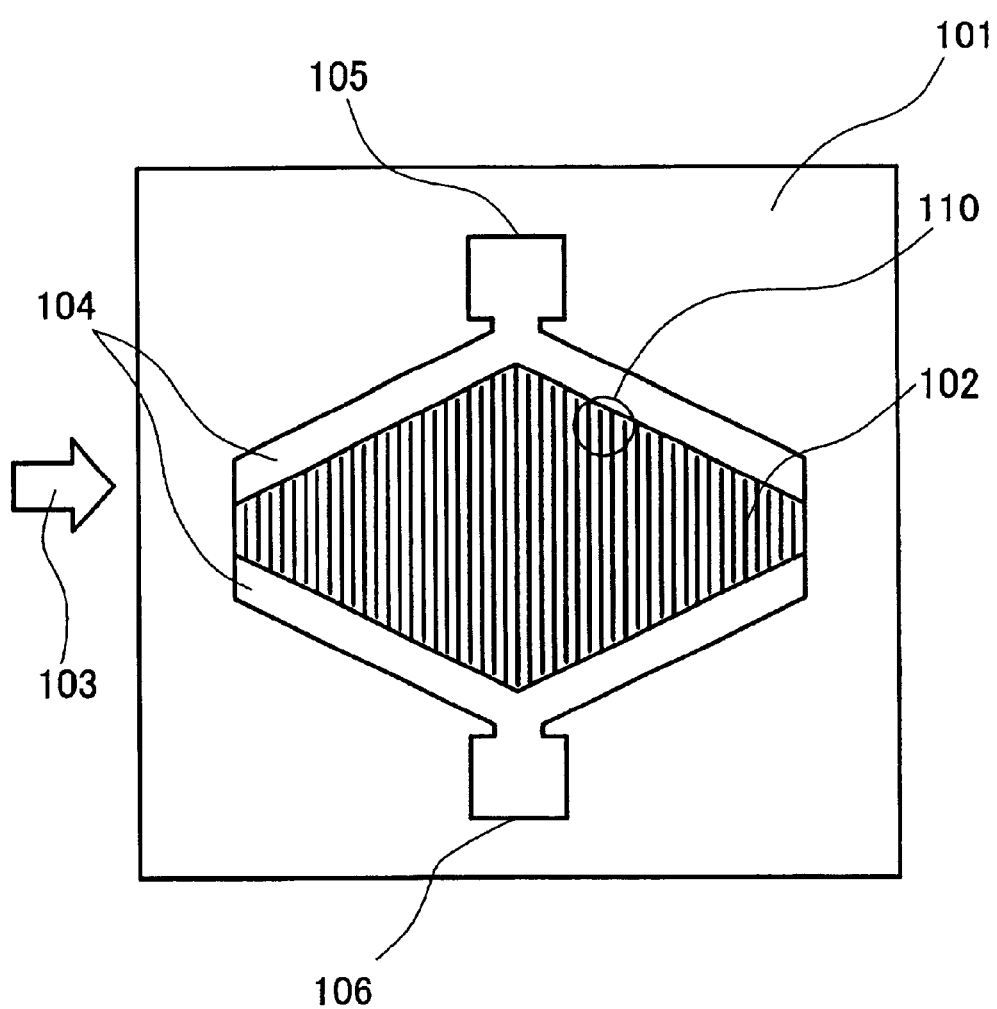
FIG. 10 is a plan view showing a third preferred embodiment of the present invention.
Figure 11:
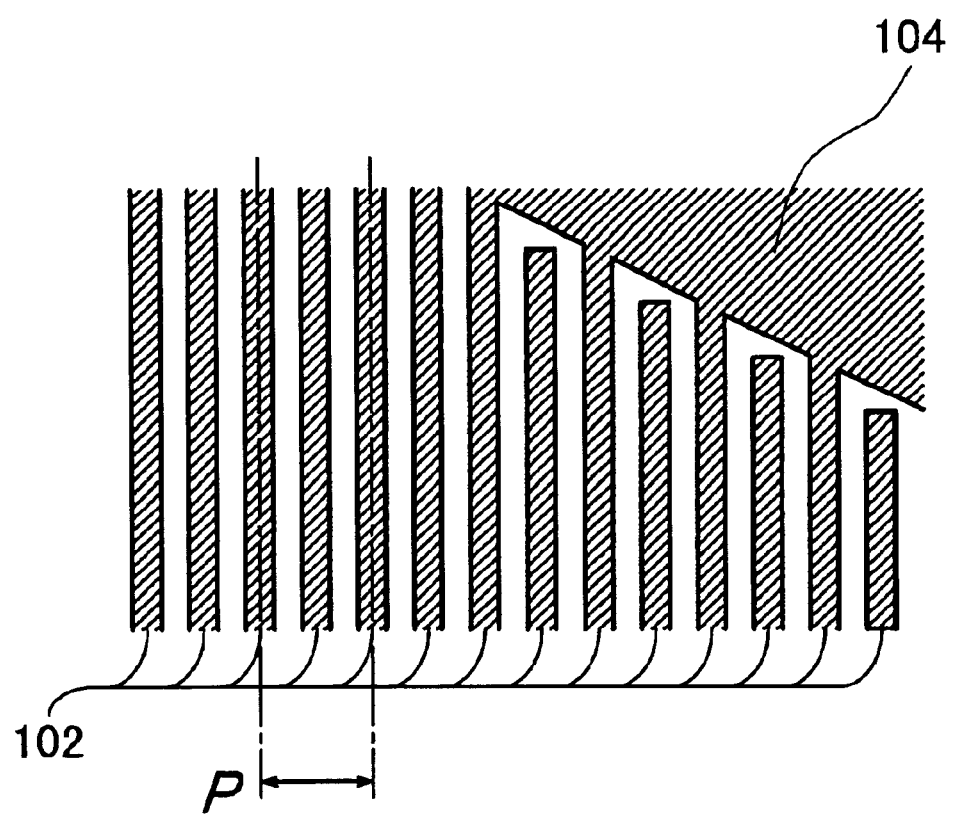
FIG. 11 is an explanatory diagram showing an enlarged view of a part 110 indicated in FIG. 10.

Referring to FIG. 10, there is shown a plan view of an SAW resonator in a third preferred embodiment of the present invention. In the third preferred embodiment, a distance between the periphery of the crossover area formed of the electrode fingers 102 and the inside face of each of the bus bars 104 is optimized so that a surface acoustic wave will not be scattered outside the excitation area. FIG. 11 shows an enlarged view of a part 110 indicated in FIG. 10.

Figure 13:
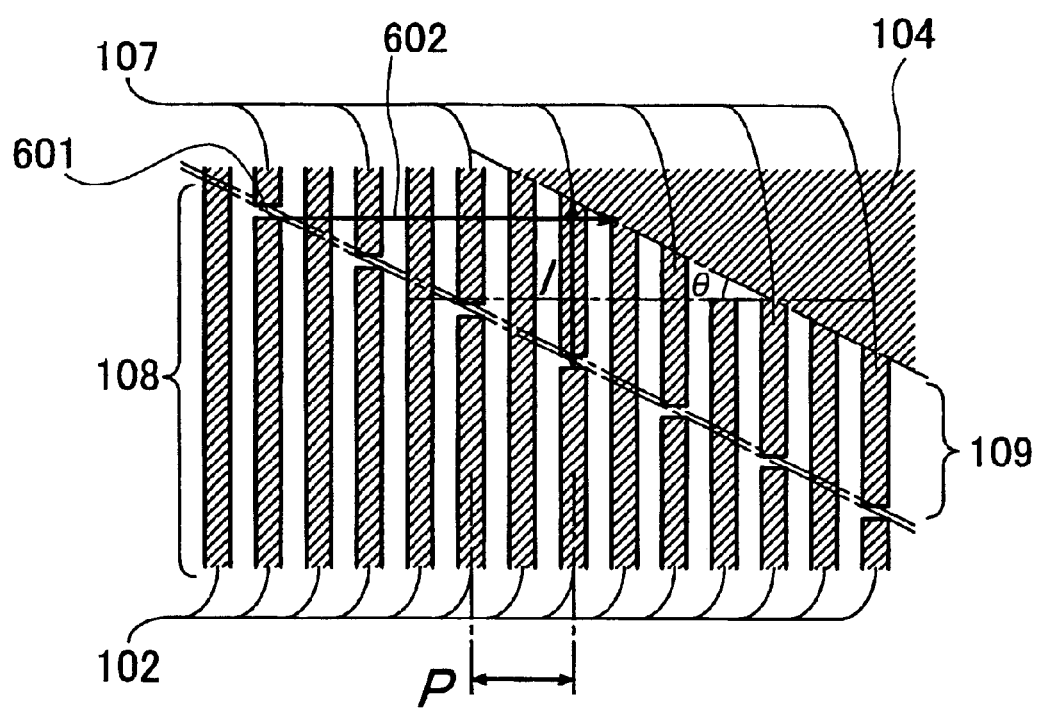
FIG. 13 is an explanatory diagram for explaining conditions to be satisfied by electrode fingers of a reflector in an SAW device according to the present invention.

With particular reference to FIG. 13, the following describes optimization of a distance between the periphery of the crossover area of the electrode fingers 102 and the inside face of the bus bar 104. The inventors have focused attention on the number of electrode fingers 107 (functioning as elements of the reflector 109) which cause the scattering of a surface acoustic wave propagating in the direction of arrow 602 after excitation at a tip part 601 of each electrode finger on the excitation area. Through comparative examination of experimental SAW resonators having different numbers of electrode fingers 107 which would cause the scattering of the surface acoustic wave, the inventors have revealed that the ripple 111 in the impedance characteristic occurs in cases where ten or more electrode fingers 107 are provided. The allowable number of electrode fingers 107 can be expressed as a mathematical function of a distance "l" between the inside face of the bus bar 104 and the tip part of each electrode finger 102 on the crossover area, a cross angle "θ" formed by the inside face of the bus bar 104 and the direction line of surface acoustic wave propagation, and an interdigital pattern period "P" of the electrode fingers 102. This condition can be indicated by the following relational expression (3) using "l", "θ", and "P":

$$\frac{l}{P}\tan\theta < 4.5 \qquad (3)$$

The third preferred embodiment corresponds to a case where "l"=0 in expression (3). When "l"=0, expression (3) holds regardless of the interdigital pattern period "P"(where P≠0) and the cross angle "θ" formed by the inside face of the bus bar 104 and the direction line of surface acoustic wave propagation. From a viewpoint of SAW resonator structure design, it is obvious that "θ"≧90° is impossible, for example. It is to be understood that proper values of "P" and "θ" should be determined according to other restrictions.

Figure 12:
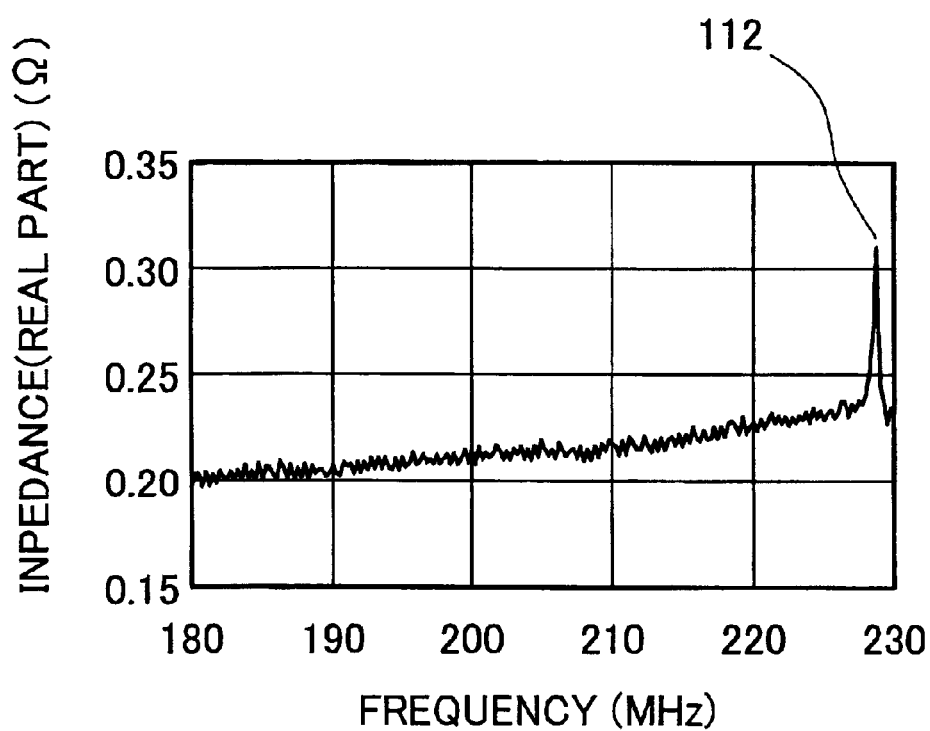
FIG. 12 is a graph showing an impedance characteristic of the third preferred embodiment in FIG. 10.

FIG. 12 shows an example of an impedance characteristic of the SAW resonator in FIG. 10. As evidenced in FIG. 12, the ripple 111 around 207 MHz in FIG. 5 does not occur. The SAW resonator in the third preferred embodiment is also fabricated through a process similar to that for the conventional SAW resonator having the impedance characteristic shown in FIG. 5. A piezoelectric substrate made of 15° YX-LN is used, and a film thickness of aluminum electrodes and an interdigital pattern pitch of electrode fingers are the same as those in the conventional SAW resonator. In the third preferred embodiment, the ripple 111 in the impedance characteristic indicated in FIG. 5 is completely eliminated. The SAW resonator in the third preferred embodiment is therefore applicable to a wide frequency band.

Figure 14:
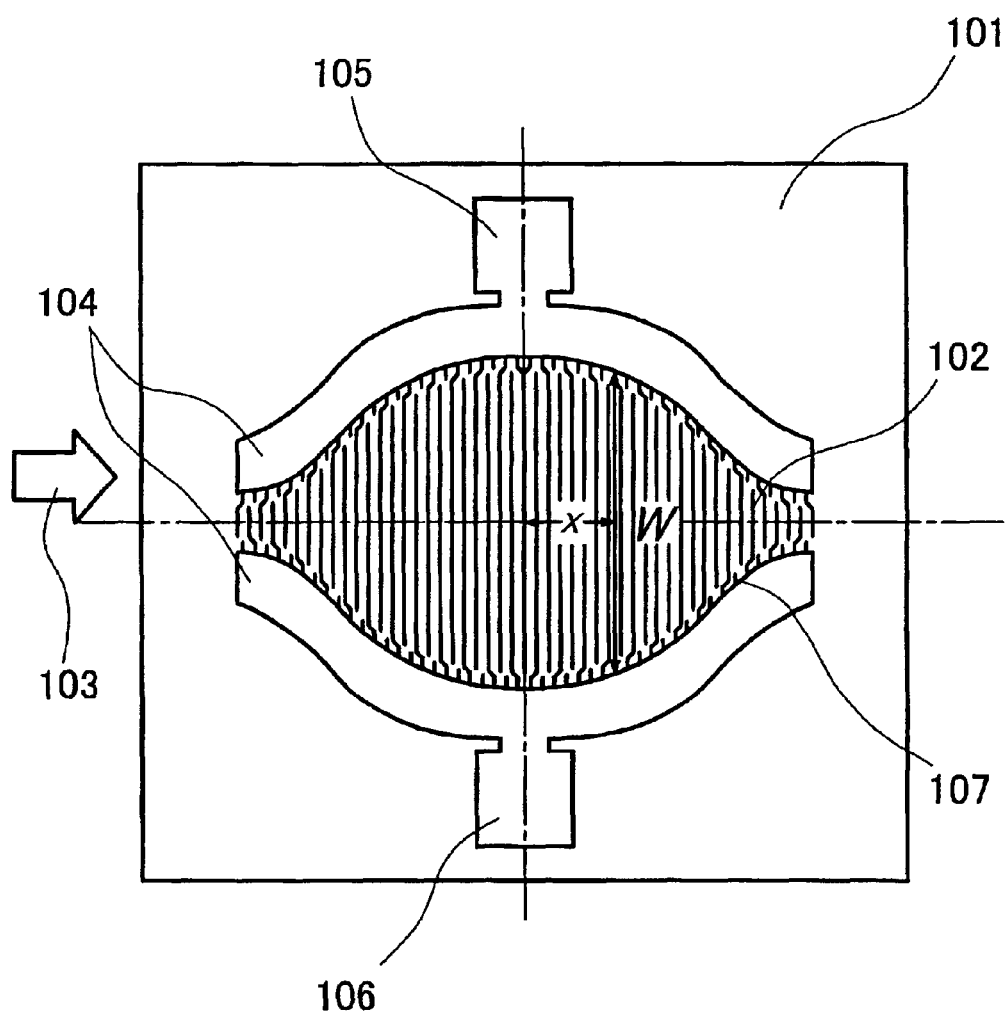
FIG. 14 is a plan view showing a fourth preferred embodiment of the present invention.

Referring to FIG. 14, there is shown a plan view of an SAW resonator in a fourth preferred embodiment of the present invention. In the fourth preferred embodiment, cosine-function apodization is made regarding the cross lengths W of the electrode fingers 102 on the excitation area 108. That is to say, a value of cross length W at a distance "x" from the center of the excitation area 108 in the horizontal direction in FIG. 14 is expressed as shown below (4):

$$W = a_1 \cdot \cos(x) + b_1 \qquad (4)$$

where $a_1$, $b_1$ are constants.

Figure 15:
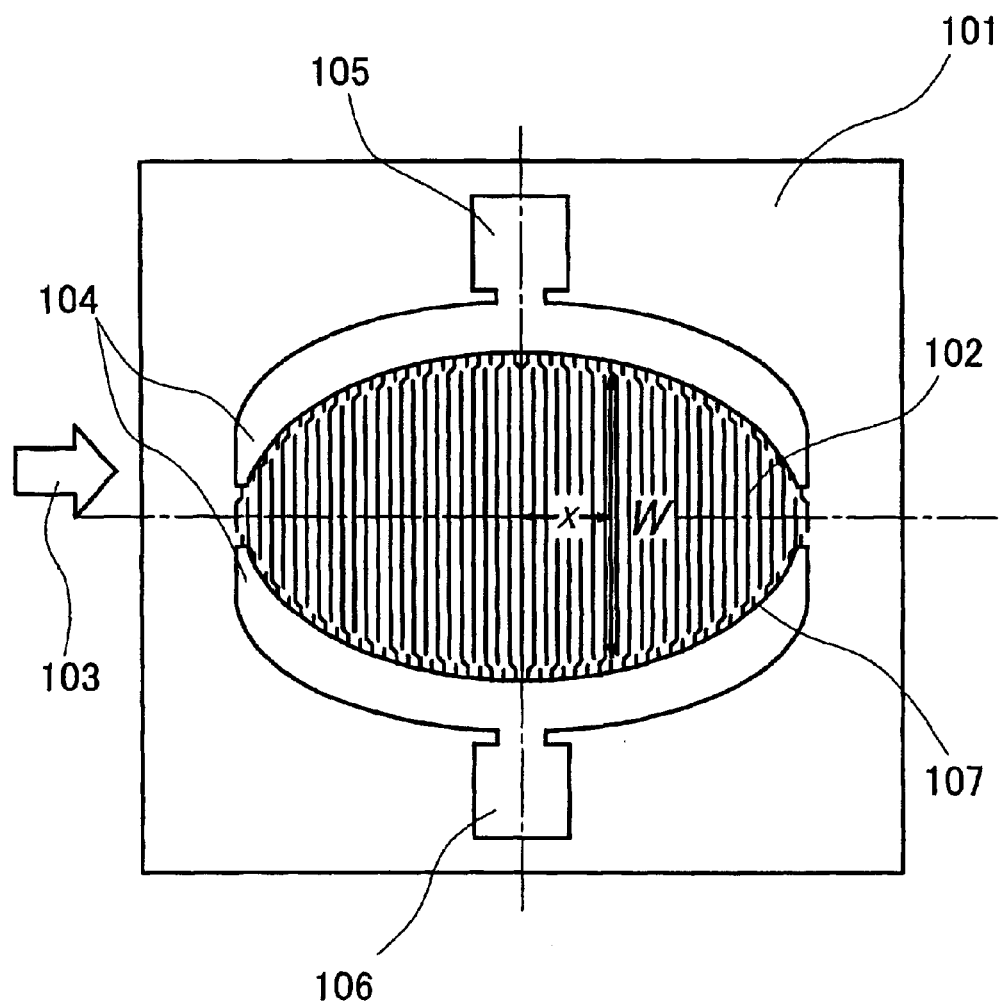
FIG. 15 is a plan view showing a fifth preferred embodiment of the present invention.

Referring to FIG. 15, there is shown a plan view of an SAW resonator in a fifth preferred embodiment of the present invention. In the fifth preferred embodiment, squared-cosine-function apodization is made regarding the cross lengths W of the electrode fingers 102 on the excitation area 108. That is to say, a value of cross length W at a distance "x" from the center of the excitation area 108 in the horizontal direction in FIG. 15 is expressed as shown below (5):

$$W = a_2 \cdot \cos^2(x) + b_2 \qquad (5)$$

where $a_2$, $b_2$ are constants.

Figure 16:
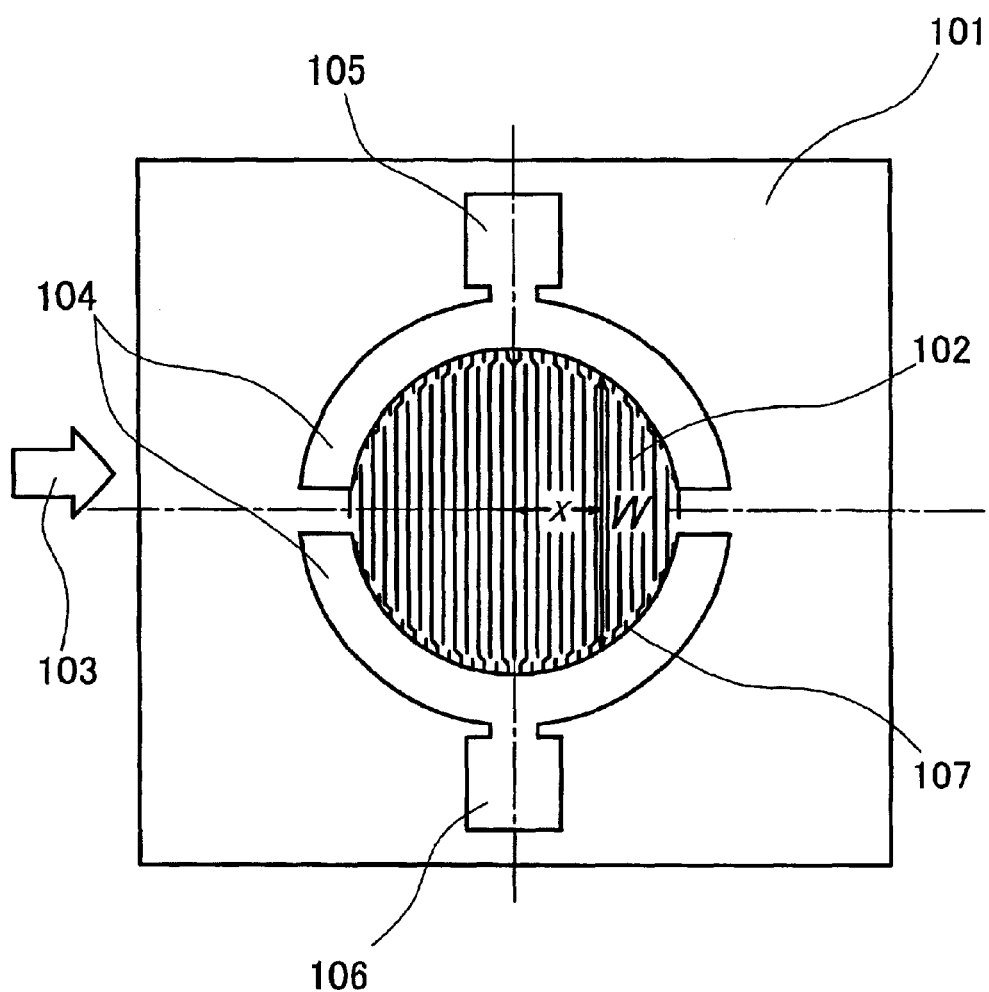
FIG. 16 is a plan view showing a sixth preferred embodiment of the present invention.

Referring to FIG. 16, there is shown a plan view of an SAW resonator in a sixth preferred embodiment of the present invention. In the sixth preferred embodiment, circle-perimeter apodization is made regarding the cross lengths W of the electrode fingers 102 on the excitation area 108. That is to say, a value of cross length W at a distance "x" from the center of the excitation area 108 in the horizontal direction in FIG. 15 is expressed as shown below (6):

$$W = a_3\sqrt{r^2 - x^2} + b_3 \qquad (6)$$

where $a_3$, $b_3$ are constants.

Further, besides the above function-type apodizations indicated as expressions (4), (5) and (6), another type of apodization is applicable to the cross lengths of the electrode fingers 102 in the present invention. For example, an equivalent advantageous effect can be attained by replacing the cosine functions of equations (4) and (5) with arccosine functions.

While the present invention has been described in detail with respect to the SAW resonators as specific embodiments of SAW devices, it is to be understood that the present invention is not limited by any of the details of description and that various changes and modifications may be made in the present invention without departing from the spirit and scope thereof. For example, it will be apparent to those skilled in the art that the present invention is applicable to an SAW filter, convolver and any other SAW device having an interdigital transducer for attaining an equivalent advantageous effect. Further, although a piezoelectric substrate made of lithium niobate is used in each of the preferred embodiments in the foregoing, it is also practicable to use a piezoelectric substrate made of a material such as lithium tantalate, quartz-crystal, potassium niobate, or langasite for obtaining an equivalent advantageous effect.

As set forth hereinabove, the present invention provides an SAW resonator which is capable of suppressing occurrence of a ripple in an impedance characteristic thereof. The SAW resonator according to the present invention is therefore advantageously applicable as a VCO oscillation element in a wide frequency band. Furthermore, since the present invention pertains merely to a technique for improvement in electrode configuration, it is possible to carry out the present invention without complicating existent fabrication processes. Still further, since an increase in device area is not required, the present invention can be practiced to mass-produce small-type low-cost SAW devices having high performance.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A surface acoustic wave device comprising:
a piezoelectric substrate;
first and second bus bars formed on said piezoelectric substrate;
an interdigital transducer having a first set of plural electrode fingers and a second set of plural electrode fingers connected with said first and second bus bars, respectively, said first and second sets of electrode fingers being arranged in an interdigital configuration; and
a crossover area on which said first and second sets of electrode fingers of said interdigital transducer are disposed in an alternate fashion;
wherein each boundary line between each of said first and second bus bars and a grating formed of said first and second sets of electrode fingers is not parallel to a group velocity direction of a surface acoustic wave excited on said interdigital transducer,
wherein the center line of each electrode finger on said crossover area is not aligned with the center line of an opposing non-crossover electrode finger, and
wherein a distance between the center line of each electrode finger on said crossover area and the center line of an opposing non-crossover electrode finger is in a range of ¹⁄₁₆ to ⁷⁄₁₆ of an interdigital pattern period of electrode fingers on said crossover area in each of said first and second sets of electrode fingers,
whereby a ripple in the characteristic impedance located to the lower frequency side of the resonant frequency is suppressed.

2. A surface acoustic wave device as claimed in claim 1, wherein apodization is made on said crossover area.

3. A surface acoustic wave device as claimed in claim 2, wherein said crossover area has a rhombic envelope configuration, and each boundary line between each of said first and second bus bars and a grating formed of said first and second sets of electrode fingers is parallel to a corresponding envelope line of said crossover area.

4. A surface acoustic wave device as claimed in claim 2, wherein said crossover area has a circular envelope configuration, and each boundary line between each of said first and second bus bars and a grating formed of said first and second sets of electrode fingers is parallel to a corresponding envelope line of said crossover area.

5. A surface acoustic wave device as claimed in claim 2, wherein said crossover area has a cosine-curve envelope configuration, and each boundary line between each of said first and second bus bars and a grating formed of said first and second sets of electrode fingers is parallel to a corresponding envelope line of said crossover area.

6. A surface acoustic wave device as claimed in claim 1, wherein said piezoelectric substrate is made of lithium niobate.

7. A surface acoustic wave device comprising:
a piezoelectric substrate;
first and second bus bars formed on said piezoelectric substrate;
an interdigital transducer having a first set of plural electrode fingers connected with said first bus bar and a second set of plural electrode fingers connected with said second bus bar; and
a crossover area on which said first and second sets of electrode fingers of said interdigital transducer are disposed in an alternate fashion;
wherein each boundary line between each of said first and second bus bars and a grating formed of said first and second sets of electrode fingers is not parallel to a group velocity direction of a surface acoustic wave excited on said interdigital transducer, and
wherein the following expression 1 is satisfied with respect to the number of electrode fingers along a perpendicular line which is extended from a tip part of each electrode finger on said crossover area to each boundary line between each of said first and second bus bars and a grating formed of said first and second sets of electrode fingers:

$$\frac{l}{P}\tan\theta f 4.5 \tag{1}$$

where "l" is a distance between the inside face of each bus bar and the tip part of each electrode finger of said grating, "e" is a cross angle formed by the inside face of each bus bar and a direction line of surface acoustic wave propagation, and "P" is an interdigital pattern period of electrode fingers;
whereby a ripple in the characteristic impedance located to the lower frequency side of the resonant frequency is suppressed.

8. A surface acoustic wave device as claimed in claim 7, wherein apodization is made on said crossover area.

9. A surface acoustic wave device as claimed in claim 8, wherein said crossover area has a rhombic envelope configuration, and each boundary line between each of said first and second bus bars and a grating formed of said first and second sets of electrode fingers is parallel to a corresponding envelope line of said crossover area.

10. A surface acoustic wave device as claimed in claim 8, wherein said crossover area has a circular envelope configuration, and each boundary line between each of said first and second bus bars and a grating formed of said first and second sets of electrode fingers is parallel to a corresponding envelope line of said crossover area.

11. A surface acoustic wave device as claimed in claim 8, wherein said crossover area has a cosine-curve envelope configuration, and each boundary line between each of said first and second bus bars and a grating formed of said first and second sets of electrode fingers is parallel to a corresponding envelope line of said crossover area.

12. A surface acoustic wave device as claimed in claim 7, wherein said piezoelectric substrate is made of lithium niobate.

* * * * *